(12) United States Patent
Butler et al.

(10) Patent No.: US 9,128,390 B2
(45) Date of Patent: *Sep. 8, 2015

(54) MULTI-STAGE SYSTEM, A CONTROL METHOD THEREFOR, AND A LITHOGRAPHIC APPARATUS

(71) Applicant: ASML NETHERLANDS B.V., Veldhoven (NL)

(72) Inventors: Hans Butler, Best (NL); Johannes Petrus Martinus Bernardus Vermeulen, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/542,263

(22) Filed: Nov. 14, 2014

(65) Prior Publication Data

US 2015/0062554 A1    Mar. 5, 2015

Related U.S. Application Data

(63) Continuation of application No. 13/477,669, filed on May 22, 2012, now Pat. No. 8,913,229.

(60) Provisional application No. 61/489,796, filed on May 25, 2011.

(51) Int. Cl.
*G03F 7/20* (2006.01)
*H02P 25/06* (2006.01)

(52) U.S. Cl.
CPC ............ *G03F 7/70725* (2013.01); *H02P 25/06* (2013.01)

(58) Field of Classification Search
CPC ............ G03F 7/70725; G03F 7/70716; G03F 7/70858; G03F 7/70866; G03F 7/70875
USPC ........................................................ 355/72
See application file for complete search history.

(56) References Cited

U.S. PATENT DOCUMENTS

2009/0251678 A1   10/2009  Ohishi
2010/0159403 A1   6/2010   Shibazaki

FOREIGN PATENT DOCUMENTS

| JP | 2001-217183 | 8/2001 |
| JP | 2005-327993 | 11/2005 |
| WO | 2012/176941 | 12/2012 |

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A multi-stage system includes a stator including a plurality of electric coils; a first stage including a first magnet assembly, the first stage moveable relative to the stator; a second stage including a second magnet assembly, the second stage moveable relative to the stator; a controller configured to position the first and the second stage relative to the stator by activating, respectively, a first subset of the plurality of electric coils to interact with the first magnet assembly and a second subset of the plurality of electric coils to interact with the second magnet assembly, the controller adapted to prevent at least one electric coil, to be simultaneously shared by the first and the second subset to position the first and the second stage on the stator, from activating.

20 Claims, 6 Drawing Sheets

MULTI-STAGE SYSTEM, A CONTROL METHOD THEREFOR, AND A LITHOGRAPHIC APPARATUS

CROSS REFERENCE TO RELATED APPLICATIONS

This application is a continuation of U.S. patent application Ser. No. 13/477,669, filed on May 22, 2012, which claims priority and benefit under 35 U.S.C. §119(e) to U.S. Provisional Patent Application Ser. No. 61/489,796, entitled "A Multi-Stage System, A Control Method Therefor, and A Lithographic Apparatus," filed on May 25, 2011, the contents of both applications being incorporated herein in their entirety by reference.

FIELD

The present invention relates to a multi-stage system, a method to control such a multi-stage system, and a lithographic apparatus including such a multi-stage system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To position an object, for instance the substrate table, it is common to use a so-called stage system. One type of stage system that is currently under development is a single-stage system comprising a stator extending substantially parallel to a first direction X and a second direction Y, wherein the second direction Y is perpendicular to the first direction X, and a first stage that is moveable relative to the stator in the first and second direction. A schematic example of such a single-stage system is shown in FIG. 2. The stator is indicated by the reference numeral 1 and the first stage is indicated by reference numeral 3.

The first stage 3 is provided with a system of magnets. For simplicity reasons it can be assumed that in the example of FIG. 2 the entire bottom area of the first stage is occupied by the system of magnets. The system of magnets generates a magnetic field that extends from the system of magnets to the stator underneath and in the vicinity of the first stage.

The stator is provided with an array of electric coils 5 of which only a few are indicated by reference numeral 5, the electric coils being configured to interact with the magnetic field generated by the system of magnets of the first stage in order to generate forces on the first stage to position them relative to the stator in the first and second direction.

It is noted here that the stator is usually mounted to or carried by a frame and thus acts as the stationary world. The first stage is able to move relative to the stator. The stage system is thus of the moving magnet type instead of the more commonly used moving coil type.

When basic control is used to position the stage relative to the stator, all coils on the stator are activated. However, with this configuration, most coils are not in the vicinity of the first stage with its system of magnets and thus have minimal interaction with the generated magnetic field. Furthermore, this does not allow for a second stage which can independently be positioned relative to the stator using the same coils.

To avoid this, only a subset of coils is activated, so that only the coils that have a non-negligible interaction with the magnetic field are activated, where non-negligible can be determined by the required position accuracy of the first stage. An example of a subset of coils is indicated in FIG. 2 by the bold coils 5. As shown in this example, only the coils directly under the first stage, i.e. the system of magnets, and in its direct vicinity are activated. The coils directly under the first stage are indicated by shading.

In FIG. 3, a multi-stage system is shown in which two stages, namely a first stage 3 and a second stage 7, are moveable relative to a stator 1 with multiple electric coils 5. To position the first stage 3, a first subset of electric coils is selected and activated as indicated by the bold coils. At the same time, the second stage can be positioned by selecting and activating a second subset of coils as indicated by the dashed coils.

A benefit of this configuration is that two stages can independently be positioned at the same time with respect to the same stator. However, the two stages can not approach each other closely, which makes certain types of operations impossible to perform.

SUMMARY

It is desirable to provide a multi-stage system in which two stages are able to approach each other closely.

According to an embodiment of the invention, there is provided a multi-stage system comprising:
a stator extending substantially parallel to a first direction;
a first stage that is moveable relative to the stator in the first;
a second stage that is moveable relative to the stator in the first;
wherein the first and second stage are each provided with a system of magnets to generate a magnetic field,
wherein the stator is provided with a plurality of electric coils, said electric coils being configured to interact with the magnetic fields generated by the system of magnets of the first and second stage in order to generate forces on the first and second stage to position them relative to the stator,
the multi-stage system further comprising:
a sensor system to determine the position of the first and second stage relative to the stator;
a control unit to position the first and second stage relative to the stator in the first direction, wherein the control unit is configured to:
determine the position of the first stage relative to the stator in the first direction based on an output of the sensor system;
select a first subset of electric coils that are capable of having a non-negligible interaction with the magnetic field of the system of magnets of the first stage in the determined position of the first stage;

determine the position of the second stage relative to the stator in the first direction based on an output of the sensor system;

select a second subset of electric coils that are capable of having a non-negligible interaction with the magnetic field of the system of magnets of the second stage in the determined position of the second stage; and activate the electric coils of the first and second subset in order to position the first and second stage relative to the stator, wherein the control unit is configured, prior to activating the electric coils of the first and second subset, to:

determine the electric coils that are part of both the first and second subset; and exclude at least one electric coil that is part of both the first and second subset from activating.

In another embodiment of the invention, there is provided a lithographic apparatus comprising a multi-stage system according to an embodiment of the invention.

In yet another embodiment of the invention, there is provided a lithographic apparatus comprising a multi-stage system including:

a carrier extending substantially parallel to a first direction and a second direction, wherein said second direction is perpendicular to the first direction;

a first stage that is moveable relative to the carrier in the first and second direction;

a second stage that is moveable relative to the carrier in the first and second direction;

wherein the first and second stage are each provided with a system of magnets to generate a magnetic field, wherein the carrier is provided with an array of electric coils, said electric coils being configured to interact with the magnetic fields generated by the system of magnets of the first and second stage in order to generate forces on the first and second stage to position them relative to the carrier, the multi-stage system further comprising:

a sensor system to determine the position of the first and second stage relative to the carrier;

a control unit to position the first and second stage relative to the carrier in the first and second direction, wherein the control unit is configured to:

determine the position of the first stage relative to the carrier in the first and second direction based on an output of the sensor system;

select a first subset of electric coils that are capable of having a non-negligible interaction with the magnetic field of the system of magnets of the first stage in the determined position of the first stage;

determine the position of the second stage relative to the carrier in the first and second direction based on an output of the sensor system;

select a second subset of electric coils that are capable of having a non-negligible interaction with the magnetic field of the system of magnets of the second stage in the determined position of the second stage; and activate the electric coils of the first and second subset in order to position the first and second stage relative to the carrier, wherein the control unit is configured, prior to activating the electric coils of the first and second subset, to:

determine the electric coils that are part of both the first and second subset; and exclude at least one electric coil that is part of both the first and second subset from activating, and wherein the lithographic apparatus further comprises:

an illumination system configured to condition a radiation beam;

a support constructed to support a patterning device, the patterning device being capable of imparting the radiation beam with a pattern in its cross-section to form a patterned radiation beam;

a first and second substrate table, each constructed to hold a substrate; and a projection system configured to project the patterned radiation beam onto a target portion of the substrate, wherein the first substrate table is provided on the first stage and the second substrate table is provided on the second stage, such that the first and second substrate table can be positioned by appropriate positioning of the first and second stage.

In a further embodiment of the invention, there is provided a method for controlling a multi-stage system comprising:

a stator extending substantially parallel to a first direction;

a first stage that is moveable relative to the stator in the first direction;

a second stage that is moveable relative to the stator in the first direction;

wherein the first and second stage are each provided with a system of magnets to generate a magnetic field, and wherein the stator is provided with a plurality of electric coils, said electric coils being configured to interact with the magnetic fields generated by the system of magnets of the first and second stage in order to generate forces on the first and second stage to position them relative to the stator in the first direction, said method comprising:

determining the position of the first stage relative to the stator in the first direction;

selecting a first subset of electric coils that are capable of having a non-negligible interaction with the magnetic field of the system of magnets of the first stage in the determined position of the first stage;

determining the position of the second stage relative to the stator in the first direction;

selecting a second subset of electric coils that are capable of having a non-negligible interaction with the magnetic field of the system of magnets of the second stage in the determined position of the second stage; and activating the electric coils of the first and second subset in order to position the first and second stage relative to the stator, wherein activating the electric coils of the first and second subset comprises:

determining the electric coils that are part of both the first and second subset; and excluding at least one electric coil that is part of both the first and second subset from activating.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
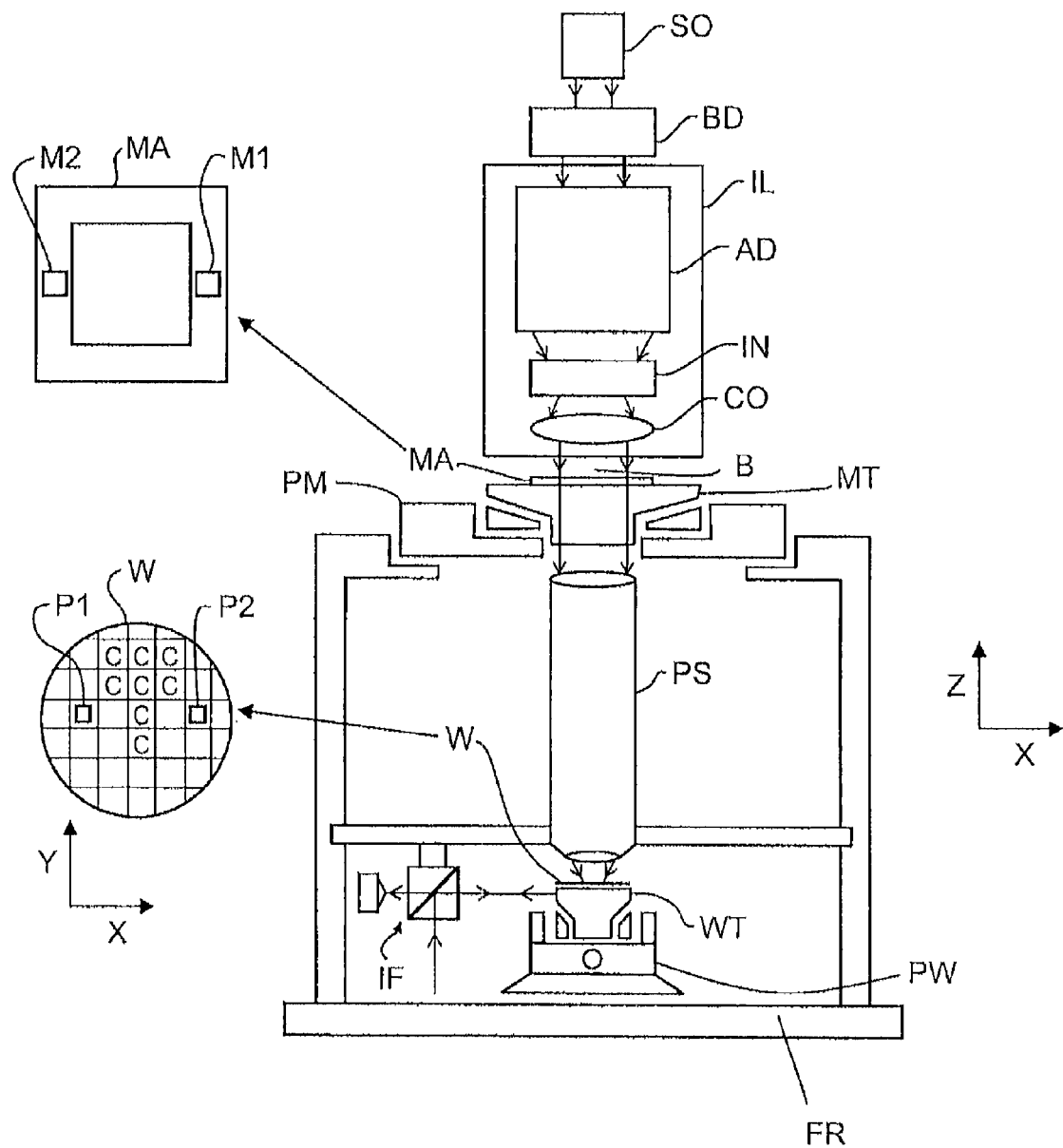
FIG. 1 depicts a lithographic apparatus according to an embodiment of the invention.
Figure 2:
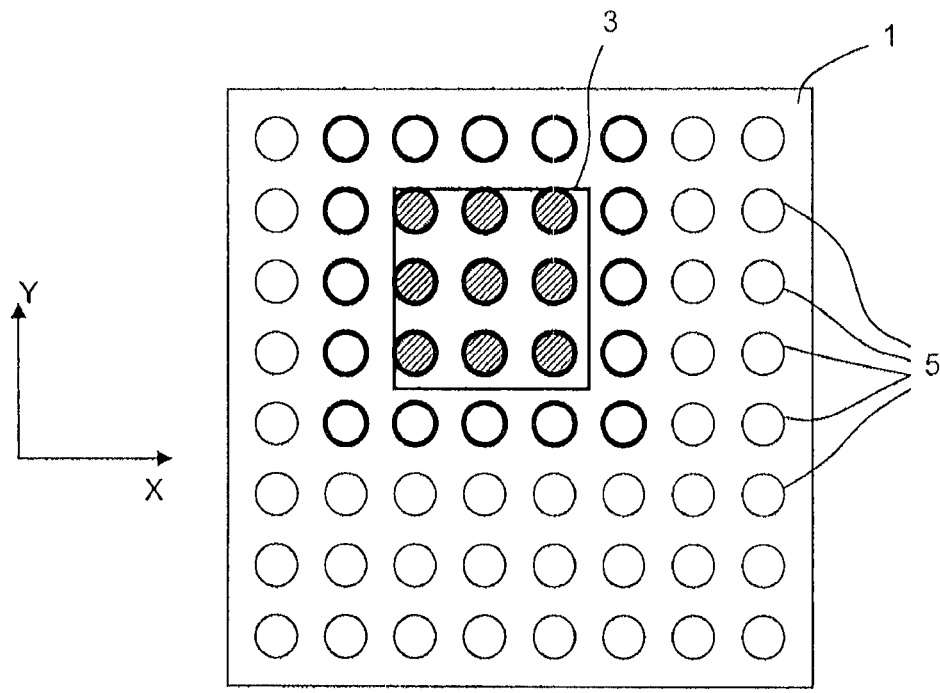
FIG. 2 depicts a conventional single-stage system.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W, The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device,"

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although FIG. 1 depicts only one positioning device PW, the lithographic apparatus comprises two and possibly more of such positioning devices PW in order to position respective substrate tables WT with respect to a frame FR. The positioning devices PW may alternatively be referred to as stages. Alternatively or additionally, other positioning devices such as the positioning device PM for the patterning device support (e.g. mask table) MT may be depicted as a single stage, where in fact more of such stages are present.

Figure 3:
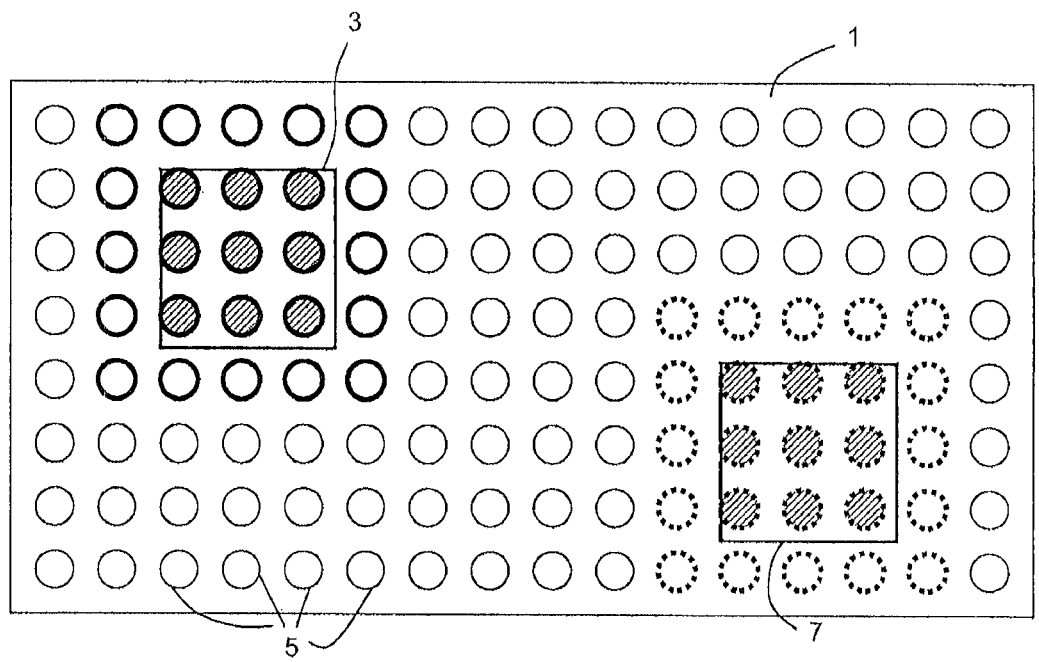
FIG. 3 depicts a multi-stage system according to an embodiment of the invention.

The frame FR of the lithographic apparatus comprises a stator 1 of which a schematic example is shown in FIG. 3. The stator 1 extends in a first direction X and in a second direction Y (see FIG. 1). The stator is provided with multiple electric coils 5 of which only a few are indicated by a corresponding reference numeral. The electric coils 5 are thus stationary mounted to the frame FR.

A first stage 3 is depicted in FIG. 3 to represent one of the positioning devices PW of FIG. 1. The first stage is schematically shown and transparent to show the underlying electric coils which are indicated by shading. The first stage 3 is moveable relative to the stator 1 in both the first and second direction X,Y, and comprises a first system of magnets to generate a first magnetic field. Although the system of magnets is not shown in FIG. 3 for simplicity reasons, it can be assumed that the outer contour of the first stage 3 in FIG. 3 is also the outer contour of the system of magnets and that thus the first magnetic field also extends to outside the first stage.

Forces can be applied to the first stage 3 due to interaction between the electric coils 5 and the first magnetic field, where the contribution of each electric coil to the forces depends on the distance and orientation to the first magnetic field.

FIG. 3 also depicts a second stage 7 to represent another one of the positioning devices PW of FIG. 1. Similar to the first stage 3, the second stage is moveable relative to the stator 1 in both the first and second direction X, Y, and comprises a second system of magnets to generate a second magnetic field.

Forces can be applied to the second stage 7 due to interaction between the electric coils 5 and the second magnetic field, where the contribution of each electric coil to the forces depends on the distance and orientation to the second magnetic field. In this embodiment, the first stage and second stage are identical and may thus be interchanged.

Figure 9:
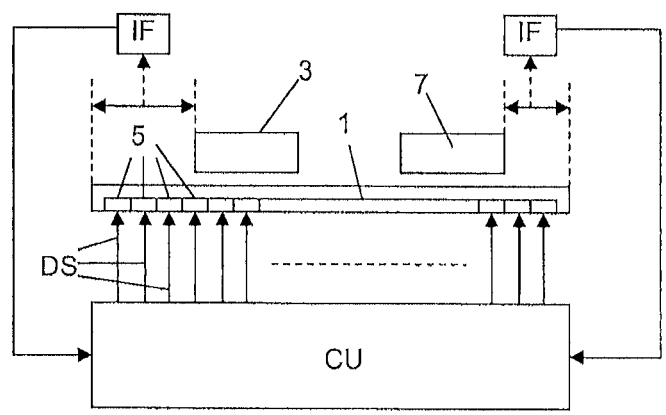
FIG. 9 depicts an assembly to control a multi-stage system in accordance with an embodiment of the invention.

To control the multi-stage system of FIG. 3, the generic and schematically depicted control scheme of FIG. 9 is used. The control scheme depicts the first stage 3, the second stage 7, and the stator 1 with the electric coils 5 from the side. The position in the first and second direction is measured by a sensor system that in this embodiment is formed by two interferometers IF, but the sensor system may also comprise for instance encoders, or a combination of encoders and interferometers. The output of the two interferometers is provided to a control unit or controller CU. It is to be noted that the position of the first and second stage may also be measured by a sensor system including multiple sensors, where the output of the multiple sensors are combined to yield the position of the first and second stage relative to the stator. This may for instance be the case when the stator is moveable relative to the frame and the positions of the first and second stage are measured relative to the frame. To determine the positions of the first and second stage relative to the stator, the position of the stator relative to the frame also has to be determined and has to be combined with the positions of the first and second stage relative to the frame.

The control unit or controller is configured to:
determine the position of the first stage 3 relative to the stator 1 in the first and second direction based on the output of the sensor system;
select a first subset of electric coils 5 that are capable of having a non-negligible interaction with the first magnetic field of the first system of magnets of the first stage 3 in the determined position of the first stage 3;
determine the position of the second stage 7 relative to the stator 1 in the first and second direction based on the output of the sensor system;
select a second subset of electric coils 5 that are capable of having a non-negligible interaction with the second magnetic field of the second system of magnets of the second stage 7 in the determined position of the second stage 7;
activate the electric coils of the first and second subset using the drive signal DS in order to position the first and second stage 3,7 relative to the stator 1,
wherein the control unit or controller CU is further configured, prior to activating the electric coils of the first and second subset, to determine the electric coils that are part of both the first and second subset and to exclude at least one electric coil that is part of both the first and second subset from activating.

In the example of FIG. 3 there is no overlap between first and second subset so that all electric coils can be activated by the control unit or controller CU. The selected and activated coils of the first subset are indicated by bold lines and the selected and activated coils of the second subset are indicated by dashed lines.

The non-negligible interaction between coils and the respective magnetic fields is determined in an embodiment by the required position accuracy and/or by the amount of force required. For both requirements it holds that the further away the electric coils are from a magnetic field, the smaller the contribution to meet these requirements is.

In the example of FIG. 3 all electric coils can be activated for the given positions of the first and second stage. Therefore, the first and second stage can independently be positioned with respect to the stator with the required position accuracy and/or amount of force. However, when the two stages approach each other, for instance when they have to perform close to each other or they have to pass each other in limited space, a coil of the first subset may also interact with the second magnetic field and a coil of the second subset may also interact with the first magnetic field. Due to this disturbance and due to the fact that a coil can only be activated for positioning one stage and not for positioning two stages at the same time, the first and second stage can not approach each other if the normal control scheme is not changed. The control unit or controller of the multi-stage system according to an embodiment is able to co cope with this problem by excluding at least one coil that is part of both the first and second subset, thereby eliminating the disturbance to the other stage of this coil, which allows the first and second stage to approach each other more closely than in prior art multi-stage systems. Additional explanation will be given by reference to the FIGS. 4-6.

Figure 4:
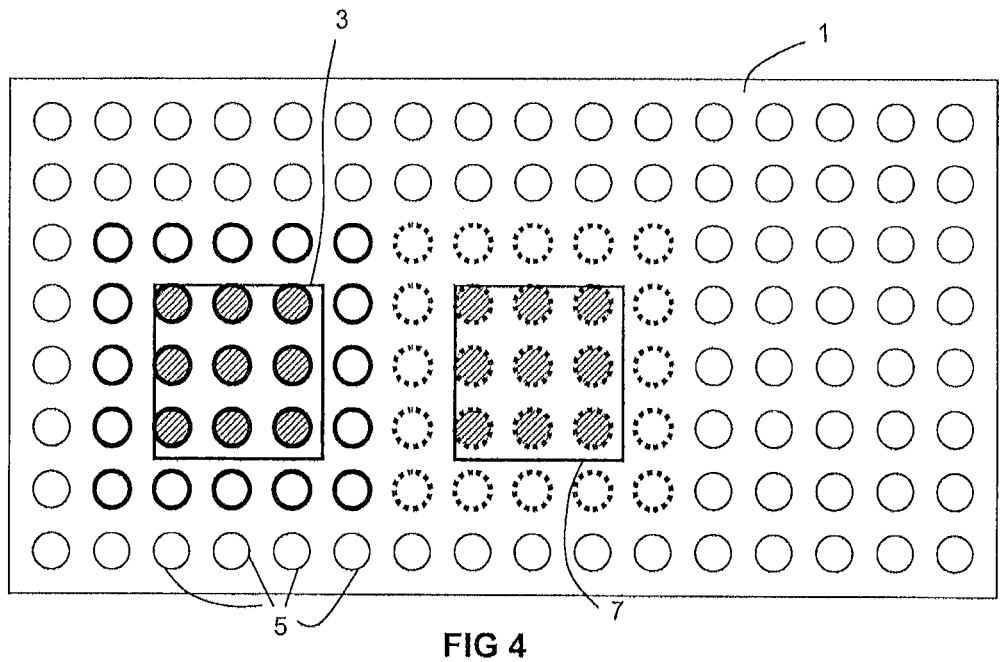
FIG. 4 depicts the multi-stage system of FIG. 3 with the stages approaching each other.
Figure 5:
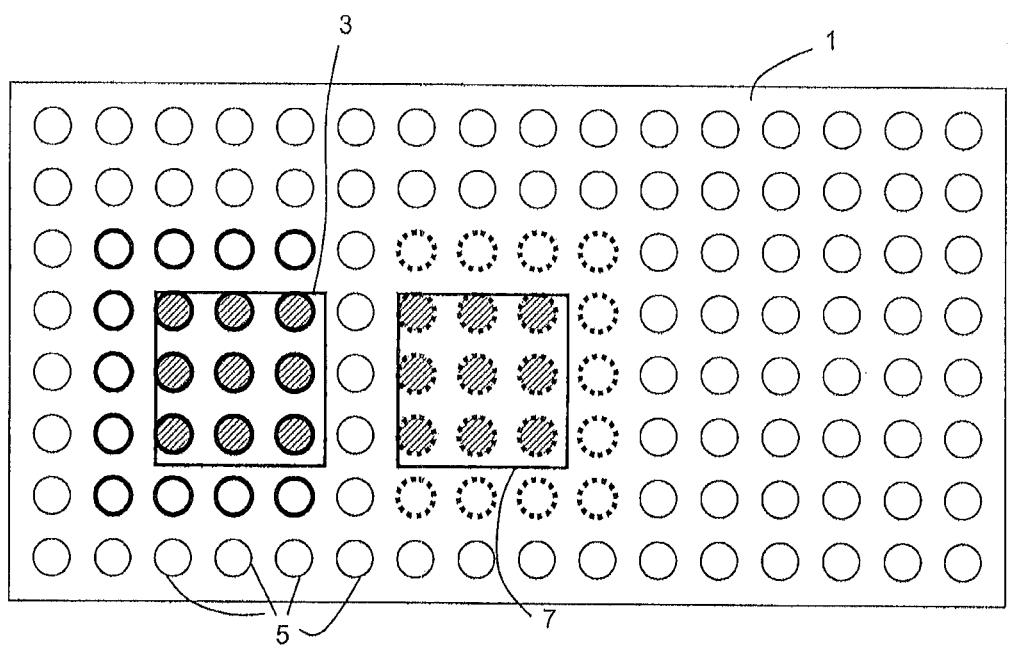
FIG. 5 depicts the multi-stage system of FIG. 3 where coils are excluded from activation to allow the approach of the stages towards each other.

FIG. 4 depicts the multi-stage system of FIG. 3 in a situation where the first stage 3 and the second stage 7 have approached each other as close as is possible using all coils of the first and second subset. In the next step, first stage 3 remains stationary relative to the stator 1 and the second stage 7 is moved towards first stage 3. At a certain moment the required second subset of electric coils should include the right most column of electric coils of the first subset in order to position the second stage. However, as this will also affect the position of the first stage, these electric coils are excluded from activation as shown in FIG. 5.

Figure 6:
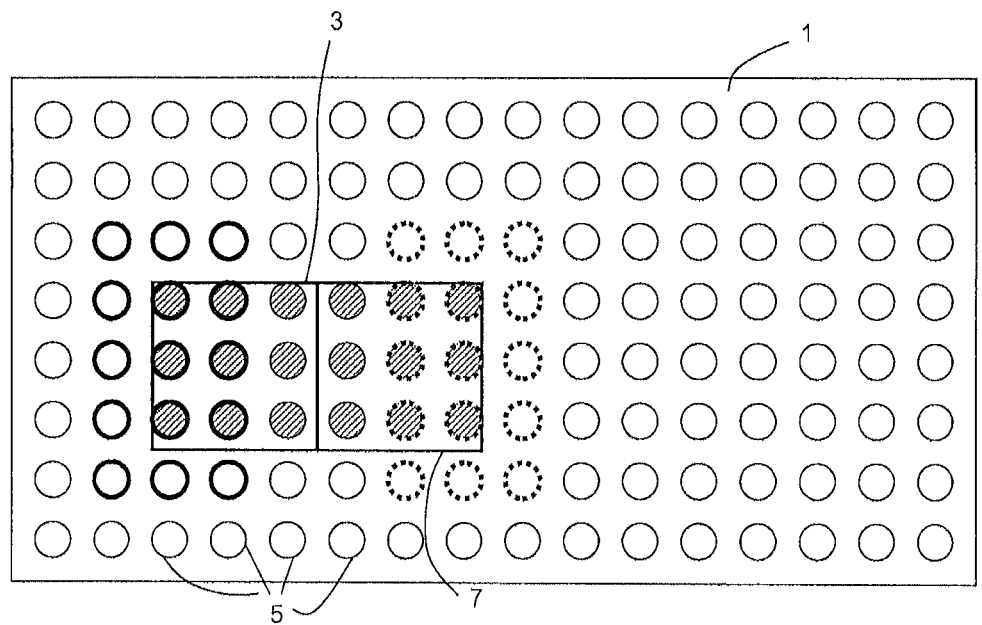
FIG. 6 depicts the multi-stage system of FIG. 3, wherein the stages contact each other.

In FIG. 6 even more electric coils have been excluded from activation in order to let the two stages touch each other.

Figure 10:
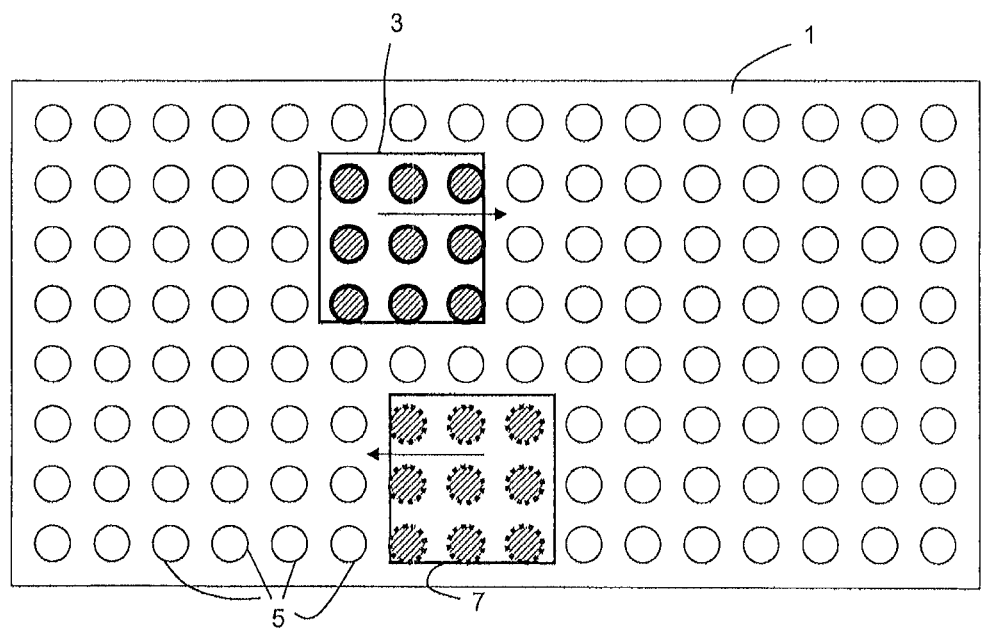
FIG. 10 depicts a multi-stage system in accordance with an embodiment of the invention.

In an embodiment, the controller may be configured such that when the two stages get into a certain distance from each other such that the first and second subset overlap, only the electric coils directly and completely beneath the corresponding system of magnets are activated. An example of this is shown with reference to FIG. 10 in which the two stages of FIG. 3 pass each other (in the by the arrows indicated directions) and during passing the first and second subset determined by the control unit overlap as a result of which only the coils directly and completely beneath the respective stages are activated by the control unit.

While controlling the multi-stage system, the control unit may further be configured to always ensure that a minimum amount of electric coils, e.g. nine electric coils, is activated in order to ensure that full control possibilities in all degrees of freedom are still available.

Figure 7:
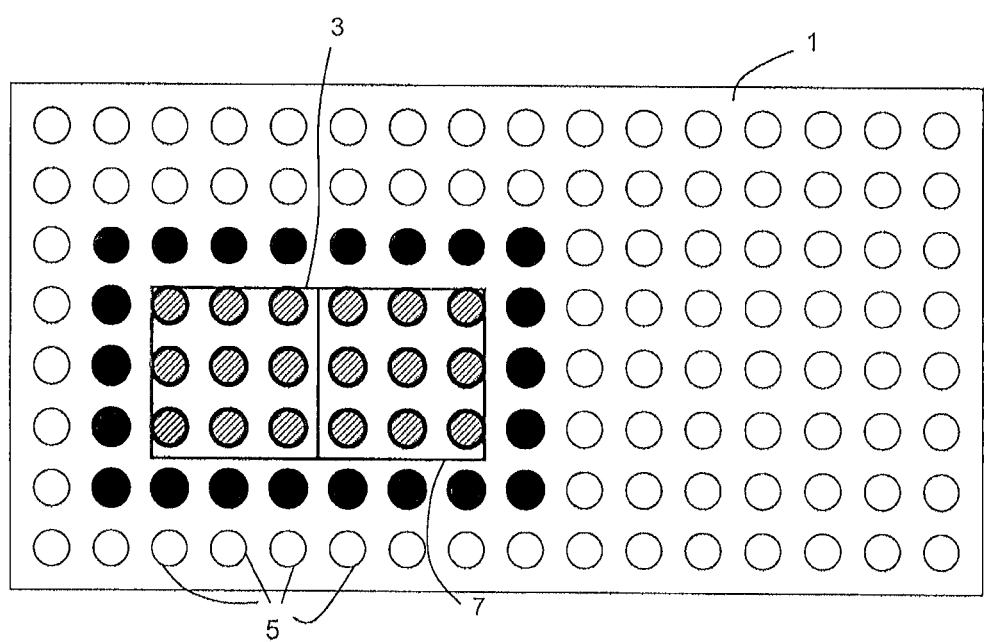
FIG. 7 depicts the multi-stage system of FIG. 3, wherein after making contact the two stages are controlled as being a larger single stage.

FIG. 7 depicts the situation of FIG. 6 in which the two stages have contacted each other, but in this embodiment the control unit is configured to position the two stages as a single stage by activating all electric coils of the first and second subset as indicated by the solid coils in FIG. 7, where coils beneath the first and second stage are also activated and indicated by shading again. The first and second stage will as a result of this move together. When required, the control unit may further be configured to add a small current to the coils such that and additional force is generated that push the two stages against each other thereby ensuring that they remain in contact. This may for instance be beneficial when the lithographic apparatus is of the type in which an immersion liquid is present between the projection system and a substrate table supported by the first or second stage and both the first and second stage move under the projection system in order to transfer the immersion liquid from one substrate table to the other substrate table which requires close contact between the two stages carrying the respective substrate tables.

Figure 8:
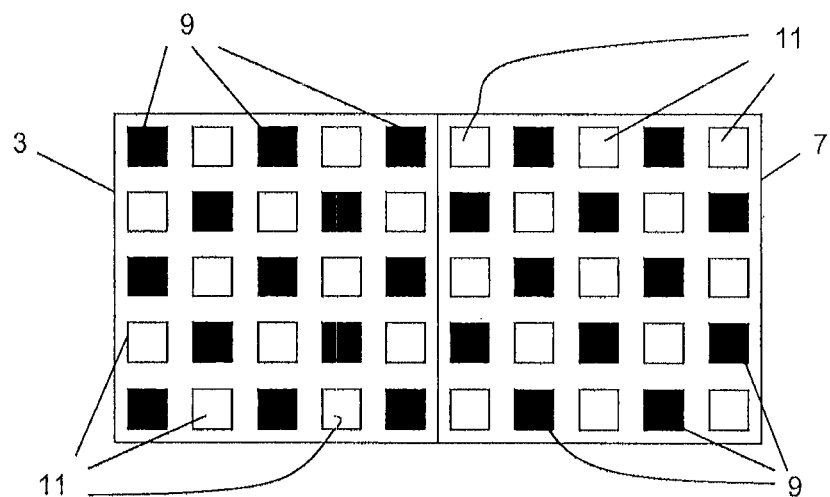
FIG. 8 depicts in more detail the system of magnets of two stages of a multi-stage system according to another embodiment of the invention.

To allow the situation of FIG. 7, the system of magnets may need to be adapted to this situation. In FIG. 8 the first stage 3 and the second stage 7 are shown from below so that the respective first and second system of magnets become visible.

Both system of magnets include first magnets 9 having a magnetization direction substantially perpendicular to the stator and directed towards the stator and second magnets 11 having a magnetization direction substantially perpendicular to the stator and directed away from the stator, the first and second magnets being arranged in accordance with a pattern of rows and columns substantially perpendicular thereto, such that the first and second magnets are arranged in each row and in each column alternately, and wherein the two stages are positionable to contact each other such that the pattern of the system of magnets of the first stage continues in the system of magnets of the second stage as shown in FIG. 8.

The system of magnets of FIG. 8 also have an odd number of rows and an odd number of columns. Further, the system of magnets of the first stage 3 has first magnets on the diagonals and the system of magnets of the second stage 7 has second magnets on the diagonals. Due to this, the stages can be rotated about a rotation axis that is perpendicular to the first and second direction without altering the pattern of the system of magnets compared to the pattern of the other system of magnets so that the stages can contact each other from each side.

It is specifically noted here that the multi-stage system is not limited by the number of degrees of freedom that can be controlled by the control unit, but usually the number of degrees of freedom that are controlled lies between 3 and 6. In case of 6 degrees of freedom per stage, this requires a minimum of nine coils to have full 6 degree of freedom control available.

It will be apparent to the skilled person that although not mentioned, the interaction between the coils and magnetic field can also be used to generate forces in a third direction perpendicular to both the first and second direction, so that a stage can also be elevated and positioned in said direction. It will further be apparent that the same principles can be applied to a system in which the first and second stage are only moveable relative to the stator in a first direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A multi-stage system comprising:
a stator including a plurality of electric coils;
a first stage including a first magnet assembly, the first stage moveable relative to the stator;
a second stage including a second magnet assembly, the second stage moveable relative to the stator;
a controller configured to position the first and the second stage relative to the stator by activating, respectively, a first subset of the plurality of electric coils to interact with the first magnet assembly and a second subset of the plurality of electric coils to interact with the second magnet assembly, said controller adapted to prevent at least one electric coil, to be simultaneously shared by the first and the second subset to position the first and the second stage on the stator, from activating.

2. The multi-stage system according to claim 1, wherein prior to activating the first and the second subset of the plurality of electric coils, the controller is configured to:
determine the electric coils that are part of both the first and the second subset; and
prevent the at least one electric coil, to be simultaneously shared by the first and second the subset to position the first and the second stage on the stator, from activating.

3. The multi-stage system according to claim 1, comprising a sensor configured to determine the position of the first and the second stage relative to the stator, the sensor in communication with the controller.

4. The multi-stage system according to claim 3, wherein the controller is configured to determine the position of the first stage relative to the stator based on an output of the sensor and to select the first subset of the plurality of electric coils capable of having a non-negligible interaction with a magnetic field of the first magnet assembly in the determined position of the first stage.

5. The multi-stage system according to claim 3, wherein the controller is configured to determine the position of the second stage relative to the stator based on an output of the sensor and to select the second subset of the plurality of electric coils capable of having a non-negligible interaction with a magnetic field of the second magnet assembly in the determined position of the second stage.

6. The multi-stage system according to claim 1, wherein the first subset is selected based on a required positioning accuracy that is to be obtained for the first stage, and wherein the second subset is selected based on a required positioning accuracy that is to be obtained for the second stage.

7. The multi-stage system according to claim 1, wherein at least the electric coils that are directly and completely beneath the respective first and second magnet assemblies are activated during the positioning of the first and the second stage.

8. The multi-stage system according to claim 1, wherein at least nine coils of the first subset and at least nine coils of the second subset are activated during the positioning of the first and the second stage.

9. The multi-stage system according to claim 1, wherein the controller is configured to allow the first and second stages to approach each other by preventing electric coils positioned between the first and the second stage from activating.

10. The multi-stage system according to claim 9, wherein the controller is configured to control the first and the second stage as a single stage when the first and the second stage have approached and contacted each other by activating all electric coils of the first and the second subset.

11. The multi-stage system according to claim 10, wherein each of the first and second magnet assemblies includes first magnets having a magnetization direction substantially perpendicular to a carrier and directed towards the carrier and second magnets having a magnetization direction substantially perpendicular to the carrier and directed away from the carrier, the first and second magnets being arranged in accordance with a pattern of rows and columns substantially perpendicular thereto, such that the first and second magnets are arranged in each row and in each column alternately, and wherein the two stages are positionable such that when the first and the second stage contact each other the pattern of the system of magnets of the first stage continues in the system of magnets of the second stage.

12. The multi-stage system according to claim 11, wherein each of the first and the second magnet assemblies has an odd number of rows and an odd number of columns, and wherein the first magnet assembly has first magnets arranged on the diagonals and the second magnet assembly has second magnets arranged on the diagonals.

13. The multi-stage system according to claim 1, wherein the stator defines a plane on which the first and second stages are movable.

14. A lithographic apparatus comprising:
a support constructed to support a patterning device, the patterning device being capable of imparting a radiation beam with a pattern in its cross-section to form a patterned radiation beam;
a first and a second object table; and
a projection system configured to project the patterned radiation beam onto a target portion of a substrate, and
a multi-stage system comprising:
a stator including a plurality of electric coils;
a first stage including a first magnet assembly, the first stage moveable relative to the stator;
a second stage including a second magnet assembly, the second stage moveable relative to the stator;
a controller configured to position the first and the second stage relative to the stator by activating, respectively, a first subset of the plurality of electric coils to interact with the first magnet assembly and a second subset of the plurality of electric coils to interact with the second magnet assembly, said controller adapted to prevent at least one electric coil, to be simultaneously shared by the first and the second subset to position the first and the second stage on the stator, from activating,
wherein the first object table is provided on the first stage and the second object table is provided on the second stage, such that the first and second object table can be positioned by appropriate positioning of the first and second stage.

15. The lithographic apparatus according to claim 14, wherein prior to activating the first and the second subset of the plurality of electric coils, the controller is configured to:
determine the electric coils that are part of both the first and the second subset; and
prevent the at least one electric coil, to be simultaneously shared by the first and the second subset to position the first and the second stage on the stator, from activating.

16. The lithographic apparatus according to claim 14, comprising a sensor configured to determine the position of the first and the second stage relative to the stator, the sensor in communication with the controller.

17. The lithographic apparatus according to claim 16, wherein the controller is configured to determine the position of the first stage relative to the stator based on an output of the sensor and to select the first subset of the plurality of electric coils capable of having a non-negligible interaction with a magnetic field of the first magnet assembly in the determined position of the first stage.

18. The lithographic apparatus according to claim 16, wherein the controller is configured to determine the position of the second stage relative to the stator based on an output of the sensor and to select the second subset of the plurality of electric coils capable of having a non-negligible interaction with a magnetic field of the second magnet assembly in the determined position of the second stage.

19. The lithographic apparatus according to claim 14, wherein the first subset is selected based on a required positioning accuracy that is to be obtained for the first stage, and wherein the second subset is selected based on a required positioning accuracy that is to be obtained for the second stage.

20. The lithographic apparatus according to claim 14, wherein at least the electric coils that are directly and completely beneath the respective first and second magnet assemblies are activated during the positioning of the first and the second stage.

* * * * *